United States Patent
Saito et al.

(10) Patent No.: US 8,283,705 B2
(45) Date of Patent: Oct. 9, 2012

(54) JUNCTION FIELD EFFECT TRANSISTOR, INTEGRATED CIRCUIT FOR SWITCHING POWER SUPPLY, AND SWITCHING POWER SUPPLY

(75) Inventors: Masaru Saito, Matsumoto (JP); Koji Sonobe, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/053,884

(22) Filed: Mar. 22, 2011

(65) Prior Publication Data

US 2011/0228575 A1  Sep. 22, 2011

Related U.S. Application Data

(62) Division of application No. 11/690,825, filed on Mar. 24, 2007, now Pat. No. 7,982,248.

(30) Foreign Application Priority Data

Mar. 24, 2006 (JP) ................................. 2006-082988

(51) Int. Cl.
   *H01L 31/112* (2006.01)
(52) U.S. Cl. ................. 257/256; 257/586; 257/E29.183
(58) Field of Classification Search .................. 257/256, 257/586, E29.183
   See application file for complete search history.

(56) References Cited

U.S. PATENT DOCUMENTS

| 5,477,175 | A | 12/1995 | Tisinger et al. |
| 6,492,689 | B2 | 12/2002 | Yamauchi et al. |
| 6,743,669 | B1 | 6/2004 | Lin et al. |
| 2001/0048122 | A1 | 12/2001 | Tada et al. |
| 2005/0077551 | A1 | 4/2005 | Halamik et al. |
| 2006/0163691 | A1 | 7/2006 | Hall et al. |
| 2008/0117653 | A1 | 5/2008 | Saito |
| 2009/0323376 | A1 | 12/2009 | Saito |

FOREIGN PATENT DOCUMENTS

| JP | 11-150234 A | 6/1999 |
| JP | 2000-252426 A | 9/2000 |
| JP | 2001-007121 A | 1/2001 |
| JP | 2001-313367 A | 11/2001 |
| JP | 2005-093696 A | 4/2005 |
| JP | 2005-094835 A | 4/2005 |
| JP | 2005-268319 A | 9/2005 |
| WO | 2005040952 A2 | 5/2005 |

OTHER PUBLICATIONS

Japanese Office Action dated May 8, 2012 issued in corresponding JP 2006-082988.
Partial translation of Notification of Reasons for Refusal dated May 2012 in corresponding JP 2006-082988. Previously submitted, without the translation, in an IDS filed May 10, 2012.

*Primary Examiner* — Samuel Gebremariam
(74) *Attorney, Agent, or Firm* — Rossi, Kimms & McDowell LLP

(57) ABSTRACT

A switching power supply has a start-up circuit that includes a field effect transistor (JFET), which has a gate region (a p-type well region) formed in a surface layer of a p-type substrate and a drift region (a first n-type well region). A plurality of source regions (second n-type well regions) are formed circumferentially around the drift region. A drain region (a third n-type well region) is formed centrally of the source region. The drain region and the source regions can be formed at the same time. A metal wiring of the source electrode wiring connected to source regions is divided into at least two groups to form at least two junction field effect transistors.

11 Claims, 7 Drawing Sheets

JUNCTION FIELD EFFECT TRANSISTOR, INTEGRATED CIRCUIT FOR SWITCHING POWER SUPPLY, AND SWITCHING POWER SUPPLY

CROSS REFERENCE TO RELATED APPLICATION

This is a divisional of U.S. patent application Ser. No. 11/690,825 filed Mar. 24, 2007, now U.S. Pat. No. 7,982,248, the entire content of which is incorporated by reference.

BACKGROUND

An IC for a switching power supply is a specific IC for controlling a discrete high voltage switching transistor. The IC obtains its own power supply during operation by operating the high voltage switching transistor. At the start, however, the IC requires a starting current power supply, which is supplied by a start-up circuit. The start-up circuit is typically integrated in the same semiconductor substrate as the IC to decrease the number of components and simplify the power supply system.

The starting current, which is an alternating current (AC) at a voltage of 100 to 240V, is rectified. It is necessary for a normally-on type element of the higher voltage side of the start-up circuit to have a breakdown voltage of around 450V to supply the starting current to the start-up circuit. The normally-on type element is realized as a lateral high voltage JFET integrated in the same semiconductor substrate as the IC for the switching power supply. A design specification of the switching power supply is determined by current drive capability of the normally-on type element.

FIG. 7 is a circuit diagram of a conventional switching power supply. An AC voltage is applied to a rectifier 103 through a fuse 102 from an AC power source 101. A direct current (DC) voltage output from the rectifier is applied to a power source capacitor 104, which becomes a DC power source. The DC voltage from the power source capacitor 104 is applied to a drain terminal of a JFET 302 of a start-up circuit 133 through a power source terminal 301 of an IC 120 for a switching power supply. In addition, the DC voltage is applied to an NMOSFET 121 through a primary winding 106 of a transformer 105. A source terminal 303 of the JFET 302 is connected to a drain terminal of an NMOSFET 304 and coupled to a gate terminal 306 of the NMOSFET 304 through a resistor 305. The gate terminal 306 connects with an NMOSFET 134 of a power section 131 of a control circuit 129. A source terminal of the NMOSFET 304 is connected to the power section 131 of the control circuit 129 and to a smoothing capacitor 110 through a start-up circuit output voltage terminal 308.

The voltage level of the gate terminal 306 is designed to be greater than the threshold voltage of the NMOSFET 304 in the voltage level of the start-up circuit output voltage terminal 308 when the smoothing capacitor 110 has been charged to a predetermined voltage value. The voltage level of the source terminal 303 of the JFET 302 is determined by the voltage level of the gate terminal 306. When a power source voltage is applied from the power source capacitor 104, the NMOSFET 304 turns on and a starting current charges the smoothing capacitor 110 through the JFET 302 and the NMOSFET 304. When the smoothing capacitor 110 reaches the predetermined voltage value, the control circuit 129 starts and the NMOSFET 121 starts to operate by a control signal from a control section 132. When the NMOSFET 121 starts to operate, the current based on the voltage induced in a second winding 111b of the transformer 105 charges the smoothing capacitor 110 through a diode 112, and the NMOSFET 121 continues operating. The current from a secondary winding 111a of the transformer 105 charges an output capacitor 108 through a diode 107, and a DC voltage/current is output through an output terminal 109 from the output capacitor 108. In addition, the NMOSFET 134 of the power section 131 turns on after the control circuit 129 starts, and the NMOSFET 304 turns off due to the voltage level of the gate terminal 306 lowering. After the NMOSFET 304 turns off, the JFET 302 turns off since the voltage level of the source terminal 303 of the JFET 302 becomes high.

FIGS. 8A-8D schematically illustrate the JFET 302 of FIG. 7. FIG. 8A is a plan of the JFET 302 (40). FIG. 8B is an enlarged detail of a section A of FIG. 8A. FIG. 8C is a cross-sectional view taken along the line 8C-8C of FIG. 8B. FIG. 8D is a cross-sectional view taken along the line 8D-8D of FIG. 8B. A gate region 1 (a p-type well region) is selectively formed in a surface layer of a p-type substrate 30 so that radially outwardly extending recessed regions each of a predetermined width are formed circumferentially around a drift region 2 (a first n-type well region), which also extends into a portion of the recessed regions of the gate region 1. A plurality of (eight shown) source regions 3 (second n-type well regions) are formed and the source regions are in contact with the drift region 2 that extends into the portion of the gate region 1. A drain region 4 (a third n-type well region) is formed opposite to and apart from the source region 3. The source regions 3 are formed equally spaced circumferentially around the drift region, with the drain region 4 positioned centrally. The source regions 3 and the drain region 4 can be formed at the same time. In addition, a metal wiring 21, namely a gate electrode electric wiring, is formed to surround regions 2, 3, and 4 on the surface of the gate region 1. The metal wiring 21 is connected to a field plate 13 formed via a LOCOS oxide film 12 on the drift region 2, and to a ground GND.

The source contact region 7 is formed in the respective surface layer within the source regions 3 and the drain contact region 8 is formed in a surface layer within the drain region 4. The source regions 3 are connected to a metal wiring 23 via the source contact regions 7, and the drain region 4 is connected to a metal wiring 24 via the drain contact region 8. A depletion layer 11 spreads from p-n junctions associated with the gate region 1, the drift region 2, and the source regions 3, which are surrounded by the gate region 1. The depletion layer 11 is narrow on the side of the source regions 3 of a high impurity concentration, and wide on the side of the drift region 2 of a low impurity concentration. Therefore spreading of the depletion layer 11 can be changed by changing the impurity concentration of the drift region 2. The channel width W1 thus can be controlled.

In the above-mentioned JFET 302 (40), the structure for a high breakdown voltage is in charge of junctions relating to the gate region 1 and the drift region 2, and the structure for a high current is in charge of the source regions 3. Thus, the high breakdown voltage and a low on-resistance are compatible by sharing of roles. In addition, the gate region 1 of the JFET 40 is always grounded, and the depletion layer 11 spreads when the source regions 3 have a bias of a positive electric potential. When a certain drain voltage is applied, the drain current continues decreasing due to the formation of channels that pinches off with rise in potential of the source region 3, and intercepts (hardly flows) the drain current when the drift region 2 (a channel region) is cut off.

In addition, Japanese Patent Laid-Open No. 2001-7121 discloses that a cut-off voltage slightly depending on the drain voltage can be realized because lateral high breakdown voltage JFETs are connected in series. Further, Japanese Patent Laid-Open No. 2005-268319 discloses that increasing the starting current can be realized without sacrificing the breakdown voltage by making a portion of a drift layer of a lateral high breakdown voltage JFET have a high impurity concentration.

In configuring the start-up circuit 133 shown in FIG. 7, an input voltage of the start-up circuit 133 is applied to the JFET 302 through the power source terminal 301, and the starting current charges the smoothing capacitor 110 through the output terminal 308. The NMOSFET 304 is made of an enhancement type to prevent a reverse current from the output terminal 308. Because the NMOSFET 304 is an enhancement type, it is necessary for the voltage level of the gate terminal 306 to be not less than the threshold voltage of the NMOSFET 304 to make itself turn on. This voltage is led through the resistor 305 from the source terminal 303 of the JFET 302. Because the source terminal of the NMOSFET 304 is connected to the start-up circuit output terminal 308, the NMOSFET 304 causes a substrate bias effect by the voltage of the start-up circuit output terminal 308, thereby increasing the threshold voltage of the NMOSFET 304 as the voltage level of the start-up circuit output terminal 308 becomes higher. Therefore, it is necessary for the voltage led to the gate terminal 306 to be more than the threshold voltage of the NMOSFET 304 in the voltage level of the start-up circuit output terminal 308 when the smoothing capacitor 110 has been charged to a predetermined voltage by the starting current.

On the other hand, the channel width W1 in the JFET 302 (40) of the input side of the start-up circuit becomes narrower as the voltage level of the source terminal 303 becomes higher. The voltage level of the source terminal 303 of the JFET 302 thus needs to be low to pass a large current. Because as above mentioned in the circuit of FIG. 7, the gate terminal 306 of the NMOSFET 304 is set to a voltage not less than the threshold voltage for the voltage level of the start-up circuit output terminal 308 when the smoothing capacitor 110 has been charged to the predetermined voltage by the starting current. Further the drain of the NMOSFET 304 is connected to the source terminal 303 of the JFET 302 and the gate terminal 306 is coupled to the source terminal 303 of the JFET 302 through the resistor 305. Then, the voltage of the source terminal 303 of the JFET 302 approximately equals to that of the gate terminal 306 so that the voltage level of the source 303 of the JFET 302 becomes high in comparison with the voltage level of the source terminal of the NMOSFET 304 (voltage level of the starting current output terminal 308).

Comparing this case with a case where the voltage level of the source terminal of the NMOSFET 304 and the voltage level of source terminal 303 of the JFET 302 approximately equal, the starting current decreases or the charging voltage level of the smoothing capacitor 110 becomes low. Otherwise, the starting current decreases and at the same time the charging voltage level of the smoothing capacitor 110 becomes low.

Accordingly, there remains a need for an improvement that can be used for a start-up circuit of an IC for a switching power supply without the drawbacks mentioned above. The present invention addresses this need.

SUMMARY OF THE INVENTION

The present invention relates to a junction field effect transistor (hereinafter referred to as JFET) that can be used for a start-up circuit, an integrated circuit (hereinafter referred to as IC) for a switching power supply, and a switching power supply used the JFET.

One aspect of the present invention is a junction field effect transistor (JFET) comprising a semiconductor substrate, a drain region, a drain electrode, a drift region, a plurality of source regions and source electrodes, a gate region, and a gate electrode. The substrate is composed of a first conductivity type. The drain region is composed of a second conductivity type and is formed in the semiconductor substrate. The drain electrode is electrically connected to the drain region. The drift region is composed of the second conductivity type and is formed in the semiconductor substrate. The source regions are composed of the second conductivity type and are formed in the semiconductor substrate. One of the source electrodes electrically connects to one of the source regions. The gate region is composed of the first conductivity and is formed in the semiconductor substrate in contact with the drift region and the source regions. The gate electrode is electrically connected to the gate region. The drift region is between the drain region and the source regions, and the source electrodes provide at least a first source electrode and a second source electrode electrically isolated from the first source electrode.

The source regions can be formed circumferentially around the drift region. The source regions can be equally spaced around the drift region. The gate region is selectively formed in a surface layer of the semiconductor substrate to provide a plurality of recessed regions that extend radially outwardly. Each of the source regions is formed in one of the recessed regions. Each of the source regions can occupy a portion of the respective recessed region or the entire region of the respective recessed region. The JFET can further include a semiconductor region of the first conductivity type formed on the drift region and in contact with the drift region.

Another aspect of the present invention is an integrated circuit (IC) for a switching power supply. The IC can include a resistor, a start-up circuit comprising a JFET, and a MOSFET of the second conductivity type having a drain terminal, a gate terminal, and a source terminal. The JFET can have a first source electrode and a second source electrode electrically isolated from the first source electrode. The drain terminal of the MOSFET is connected to the first source electrode of the JFET. The gate terminal of the MOSFET is connected to the second source electrode of the JFET through the resistor, and is adapted to be connected to a control circuit for outputting a control signal for controlling a switching element. The source terminal of the MOSFET is adapted to be connected to the control circuit and a capacitor.

The IC can include the control circuit. The start-up circuit and the control circuit can be integrated in a same semiconductor substrate. The JFET can be the previously described JFET in the first aspect of the present invention.

Another aspect of the present invention is a switching power supply including the previously described control circuit for outputting a control signal for controlling a switching element, a capacitor, and a previously described start-up circuit in the second aspect of the present invention. The gate terminal of the MOSFET is connected to the second source electrode of the JFET through the resistor, and is connected to the control circuit, and the source terminal of the MOSFET is connected to the control circuit and to the capacitor.

The JFET can be as described in the first aspect of the present invention.

DETAILED DESCRIPTION

Figure 1A:
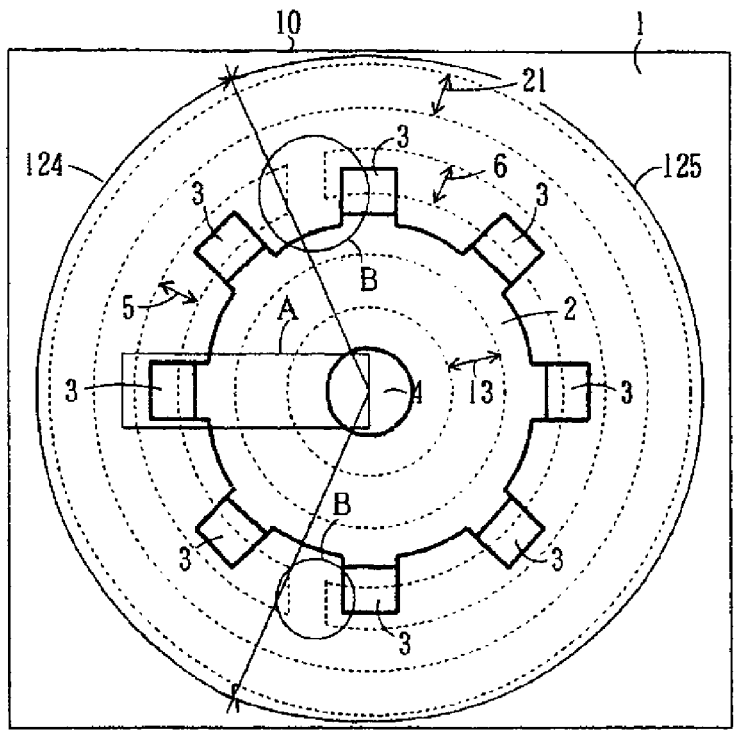
FIGS. 1A-1D schematically illustrate a first embodiment of a junction field effect transistor (JFET) according to the present invention.
Figure 1B:
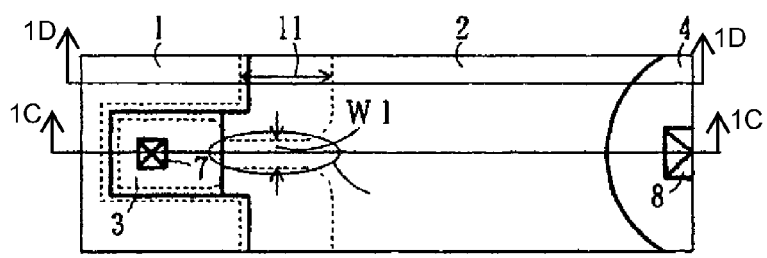
Figure 1C:
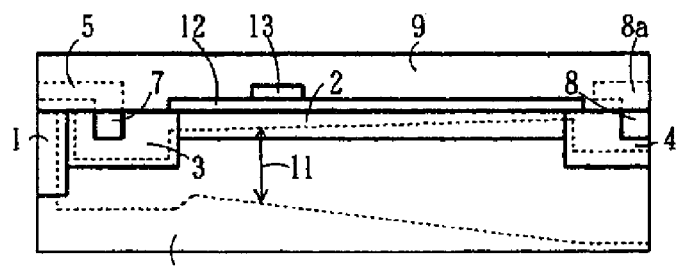
Figure 1D:
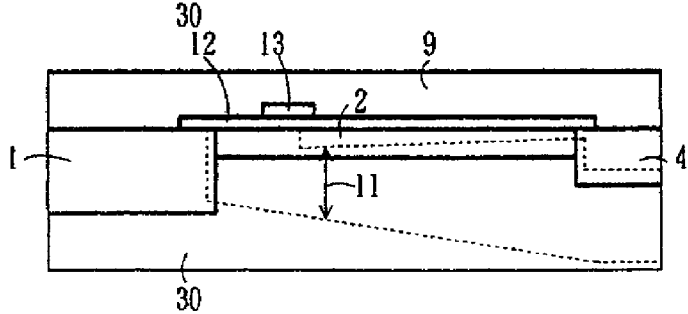

FIGS. 1A-1D schematically illustrate a first embodiment of a junction field effect transistor (JFET). FIG. 1A is a plan view of the JFET 10. FIG. 1B is an enlarged detail of a section A of FIG. 1A. FIG. 1C is a cross-sectional view taken along the line 1C-1C of FIG. 1B. FIG. 1D is a cross-sectional view taken along the line 1D-1D of FIG. 1B. The JFET 10 is a JFET of a normally-on type for start-up that supplies a starting electric power to a control circuit 129 of FIG. 3.

Configuration of the JFET 10 will be explained with reference to FIGS. 1A-1D. A gate region 1 (a p-type well region) is selectively formed in a surface layer of a p-type substrate 30 so that radially outwardly extending recessed regions each of a predetermined width are formed circumferentially around a drift region 2 (a first n-type well region), which also extends into a portion of the recessed regions of the gate region 1. Source regions 3 (second n-type well regions; 8 illustrated in this embodiment) are formed in the recessed regions of the gate region 1. The source regions 3 are in contact with the portion of the drift region 2 that extends into the gate region 1. A drain region 4 (a third n-type well region) is formed opposite to and apart from the source region 3. The source regions 3 are formed equally spaced circumferentially around the drift region 2, with the drain region form centrally thereof. The source region 3 and the drain region 4 can be formed by diffusion at the same time. In addition, a metal wiring 21, namely a gate electrode wiring, is formed on the surface of the gate region 1 to surround the drift region 2, the source region 3, and the drain region 4. An insulating film (LOCOS oxide film) 12 is formed on the drift region 2. A field plate 13 of polysilicon is formed on the insulating film 12 over the drift region. An insulating film 9 is formed over the substrate.

The source contact region 7 is formed in the respective surface layer of each of the source regions 3, and a drain contact region 8 is formed in a surface layer of the drain region 4. A depletion layer 11, which is based on p-n junctions associated with the source regions 3, which is surrounded by the gate region 1, the drift region 2, and the gate region 1, spreads small to the side of the source region 3 of a high impurity concentration and wide to the side of the drift region 2 of a low impurity concentration. Therefore, the spreading of a depletion layer can be changed by changing the impurity concentration of the drift region 2, and thereby the channel width W1 can be controlled. The gate region 1 of JFET 10 is always grounded. In addition, connections of the source regions 3 are divided into at least two groups, i.e., a first group of the source regions 3 is connected to a metal wiring 6 (a gate terminal of an NMOSFET 125 of FIG. 3) through the source contact regions 7 and a second group of the source regions 3 is connected to a metal wiring 5 (a source terminal of an NMOSFET 124 of FIG. 3) through the source contact regions 7. This effectively forms an equivalent of a plurality of JFETs. The roles are shared by the two JFETs so that the junction between the gate region 1 and the drift region 2 handles a high breakdown voltage and the source regions 3 handles a large current, so that a high breakdown voltage and a low on-resistance are compatible. A plurality of equivalent JFETs can be obtained by dividing a conventional metal wiring 23 into two metal wirings 5 and 6 in sections B. Although FIGS. 1A-1D do not illustrate it, the metal wiring 21 is connected to the gate region 1, the field plate 13, and a ground GND.

Regarding the JFET 10, when a voltage is supplied to the drain contact region 8, drain current flows radically. When the source contact region 7 is biased in a positive electric potential and the potential of the source contact region 7 reaches a certain potential due to rise, the drain current becomes interrupted due to the drift region 2 being cut off by the depletion layer 11. When the JFET 10 is used for a start-up circuit 133 of FIG. 3, the breakdown voltage between the drain and the source is designed to have not less than the breakdown voltage of 500V mainly in the junction between the gate region 1 and the drift region 2.

Figure 3:
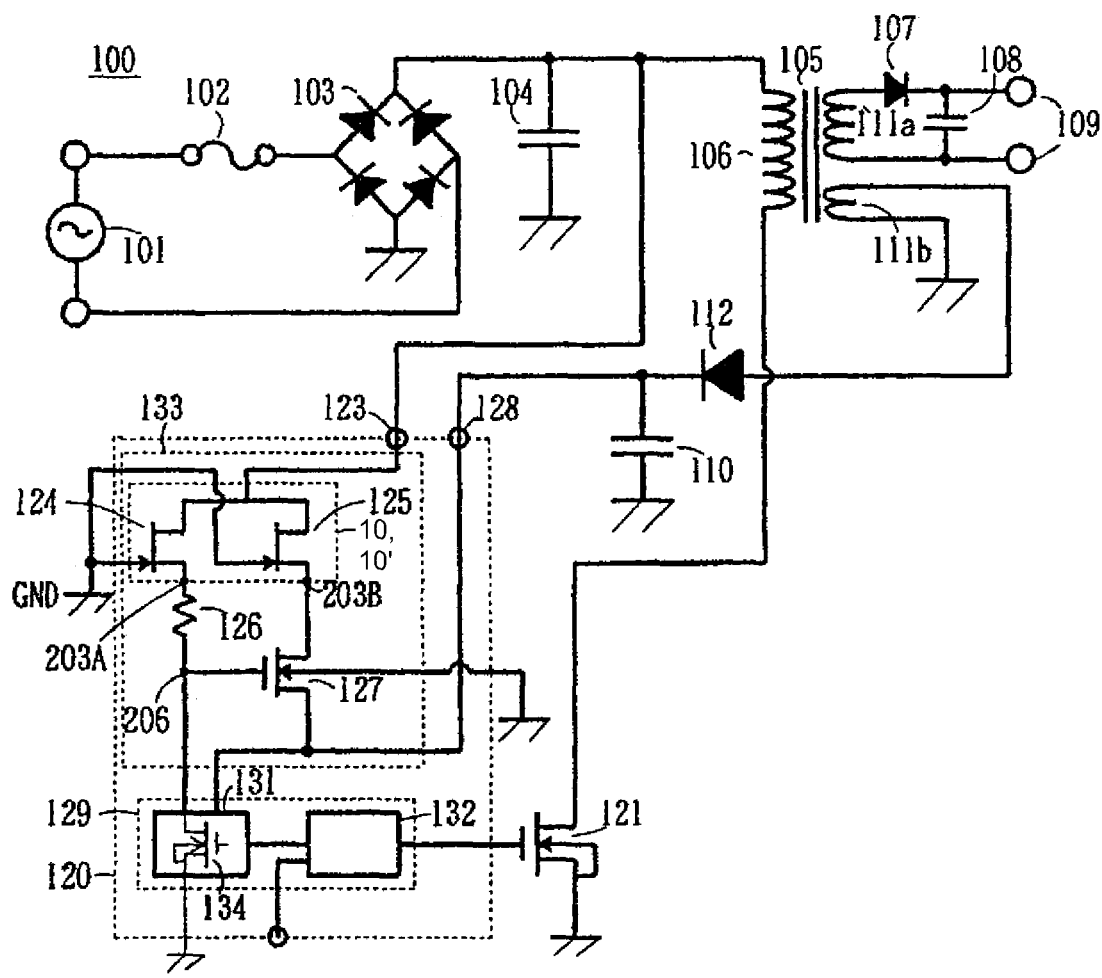
FIG. 3 is a circuit diagram of a switching power supply according to the present invention.

As shown in an IC 120 for a switching power supply of FIG. 3, a source terminal 203B of the JFET 125 is connected to a drain of an NMOSFET 127 composing the start-up circuit 133, and a source terminal 203A of the JFET 124 is connected to a gate terminal 206 of the NMOSFET 127 through a resistor 126 respectively. The metal wirings 6 and 5 are usually disposed so that the number of the source regions 3 of the JFET 125 composing the JFET 10 and connecting to the drain of the NMOSFET 127 is more than that of the source regions 3 of JFET 124 composing JFET 10 and coupled to the gate terminal 206 of the NMOSFET 127 because of securing starting current. In this embodiment, the first group is composed of five source regions and the second group is composed of three source regions. In another embodiment, the first group can be composed of seven source regions and the second group can be composed of one source region because the number of the source regions composing the group is not fixed. In addition, although this embodiment has two groups, the number of groups can be increased so that the number of equivalent JFETs is increased.

Because, in the JFET 10 (n-type MOSFETs 124 and 125) of FIG. 1, two source terminals (metal wirings 5 and 6) for taking out current from channels formed between the drain region 4 and a plurality of source regions 3 are disposed, a plurality of terminals for taking out current can be obtained (two source terminals 203A and 203B). Because the voltage applied to the respective source terminal can be made independent, the degree of freedom of current control increases.

Figure 2A:
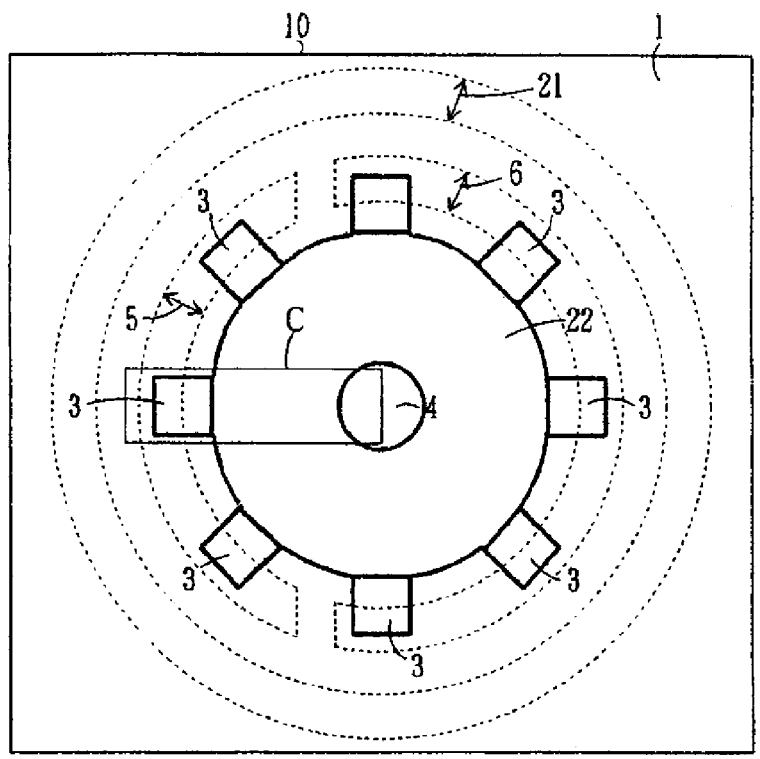
FIGS. 2A-2D schematically illustrate a second embodiment of a JFET according to the present invention.
Figure 2B:
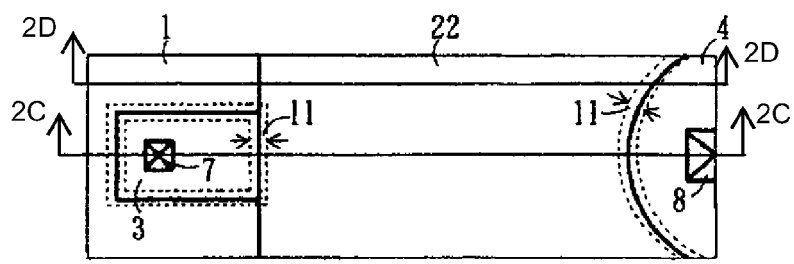
Figure 2C:
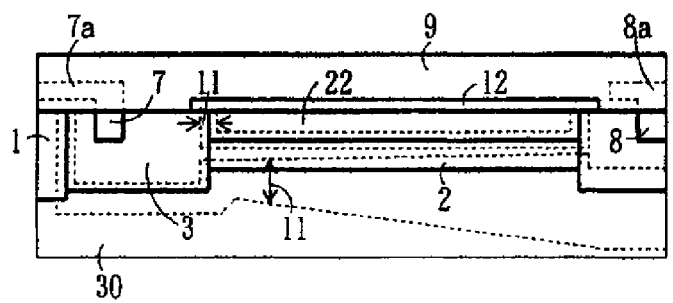
Figure 2D:
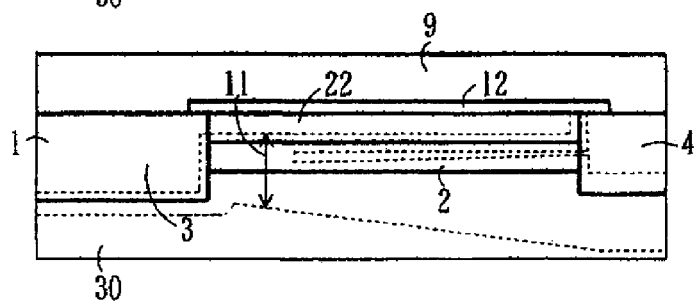

FIGS. 2A-2D schematically illustrate a second embodiment of a JFET according to the present invention. FIG. 2A is a plan view of the JFET 10'. FIG. 2B is an enlarged detail of a section A of FIG. 2A. FIG. 2C is a cross-sectional view taken along the line 2C-2C of FIG. 2B. FIG. 2D is a cross-sectional view taken along the line 2D-2D of FIG. 2B. The JFET 10' of the second embodiment is different from the JFET 10 of the first embodiment in that the JFET 10' has a p-type semiconductor region 22 in contact with the gate region 1 formed on the drift region 2, and the drift region 2 is interposed between the p-type semiconductor region 22 and a p-type substrate 30. Therefore, the depletion layer 11 spreads in vicinity of the drift region 2 in contact with the source regions 3 and from the top surface and the lower surface of the drift region 2, and then the drift region 2 becomes pinched off and further become cut off due to an increase in the drain voltage. In other words, the depletion layer 11 spreads in a vertical direction in the JFET 10' whereas the depletion layer 11 spreads in a lateral direction in the JFET 10. Operation of the JFET 10' is the same as that of the JFET 10.

In addition, the JFET 10' has each of the source regions 3 formed in the entire portion of the radially extending recessed portions of the gate region 1. The JFET 10', however, also can form each of the source regions 3 formed in a portion of the recessed portions of the gate region like those of the JFET 10.

FIG. 3 is a circuit diagram of a switching power supply 100 according to the present invention. The switching power supply 100 incorporates the JFET 10, 10' in the start-up circuit 133. Accordingly, the switching power supply 100 is different from that of FIG. 7 in the start-up circuit. As in the switching power supply of FIG. 7, an AC voltage is applied to the rectifier 103 through the fuse 102 from the AC power source 101. A DC voltage output from the rectifier 103 is applied to the power source capacitor 104 so that the power source capacitor 104 becomes a DC power supply. The DC voltage from the power source capacitor 104 is applied to the primary winding 106 of the transformer 105.

In the present switching power supply 100, the DC voltage is applied to a drain terminal 123 of the JFET 10, 10', which comprises the JFETs 124 and 125 of the IC 120 for a switching power supply from the power source capacitor 104. The gate terminals of the JFETs 124 and 125 are fixed to a potential of the ground GND, and the source terminal 203A of the JFET 124 is connected to the gate terminal 206 of the NMOSFET 127 and the control circuit 129 through the resistor 126. The source terminal 203B of the JFET 125 is connected to the drain terminal of the NMOSFET 127, and the source terminal of the NMOSFET 127 is connected to the control circuit 129 and the smoothing capacitor 110.

The control circuit 129 is composed of the power section 131 and the control section 132, and the power section 131 supplies an electric power to the control section 132. In addition, although not illustrated in the power section 131, constant current circuits are respectively connected to the gate terminal 206 and the source terminal of the NMOSFET 127 are provided so that constant current flows respectively in the JFET 124 and the JFET 125. Further, the power section 131 has an NMOSFET 134 that turns on when the smoothing capacitor 110 has been charged to a predetermined voltage. The predetermined voltage means the voltage that can allow the control circuit 129 to start stably.

Operation of the control circuit 129 follows. Constant current flows to the JFET 124 from a power source connected to the drain terminal 123 of the JFET 10, 10'. The voltage of the gate terminal 206 is set more than the threshold voltage of the NMOSFET 127 so that the NMOSFET 127 is maintained in the on-state at the voltage level of the start-up circuit output voltage terminal 128 before the smoothing capacitor 110 is charged to the predetermined voltage. Therefore, the NMOSFET 127 turns on and constant current (starting current) flows to the JFET 125 and the NMOSFET 127, and the smoothing capacitor 110 is charged. The starting current is designed to be within a range where the starting current does not decrease due to a channel of JFET 125 being narrowed at the voltage level of the start-up circuit output terminal 128 when the smoothing capacitor 110 has been charged to the predetermined voltage. If current capability of a channel of the NMOSFET 127 is ensured enough in comparison with the starting current (for example, the channel width is designed enough widely), the degree of design freedom increases because the potential difference occurring between the drain and the source of the NMOSFET 127 is small. When the smoothing capacitor 110 has been charged to the predetermined voltage, the control circuit 129 starts operation, and then an NMOSFET 121 starts operation.

When the NMOSFET 121 starts operation, current from the second winding 111b of the transformer 105 charges the smoothing capacitor 110 through the diode 112, and then the NMOSFET 121 continues operating. In addition, current from the second winding 111a of the transformer 105 charges the output capacitor 108 through the diode 107 when the control circuit 129 starts so that DC voltage/current is output through the output terminal 109 from the output capacitor 108.

In addition, the NMOSFET 134 of the power section 131 is turned on when the control circuit 129 starts operation, and the NMOSFET 127 are turned off due to the voltage level of the gate terminal 206 becoming less than the threshold voltage of the NMOSFET 127. A voltage level of the source terminal of the JFET 125 becomes high due to the NMOSFET 127 turning off, and the drain current (the constant current) is intercepted due to the drift region (channel) of the JFET 125 being cut off. The voltage level of the source terminal of the JFET 124 becomes high due to the voltage drop by the resistor 126, and the drain current of the JFET 124 is intercepted due to the drift region (channel) of the JFET 124 being cut off.

Thus, in the switching power supply 100 shown in FIG. 3, because the gate terminal 206 is separated from the drain terminal of the NMOSFET 127, the voltage level of the gate terminal 206 is independent of the voltage level of the drain terminal of the NMOSFET 127. Therefore, because the voltage level of source terminal 203B of JFET 125 can be lowered to approximately the same voltage level as the source terminal of the NMOFET 127, the starting current can be increased in comparison with the switching power supply of FIG. 7 when the charging voltage level of the smoothing capacitor 110 is raised to the predetermined voltage level. In addition, because the voltage level of source terminal 203B of JFET 125 can be lowered to approximately the same voltage level of the source terminal of the NMOFET 127, the voltage level of the start-up circuit output terminal 128 can be made high in comparison with the switching power supply showed in FIG. 7 when a predetermined starting current is passed. The operation will be further concretely explained using numerical value as follows.

Figure 4:
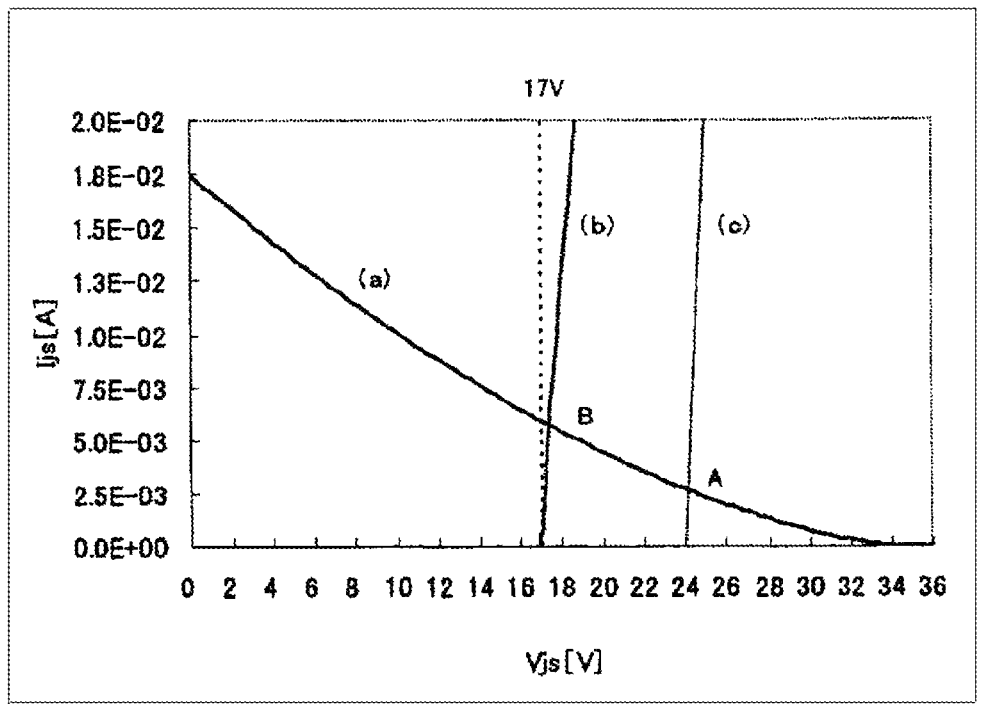
FIG. 4 illustrates voltage-ampere curves of a JFET 125 of FIGS. 1A-1D, an NMOSFET 127 of FIG. 3, and an NMOSFET 304 of FIG. 7.
Figure 7:
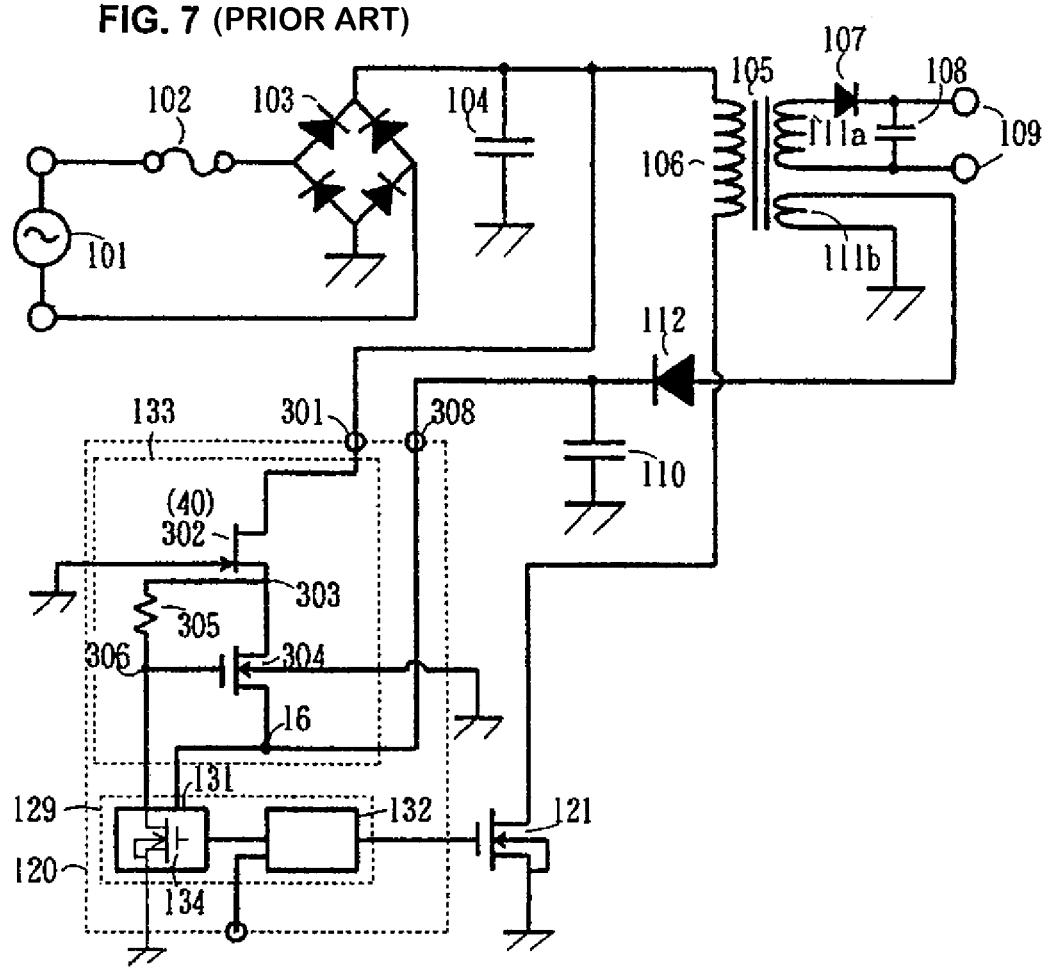
FIG. 7 is a circuit diagram of a conventional switching power supply.
Figure 8A:
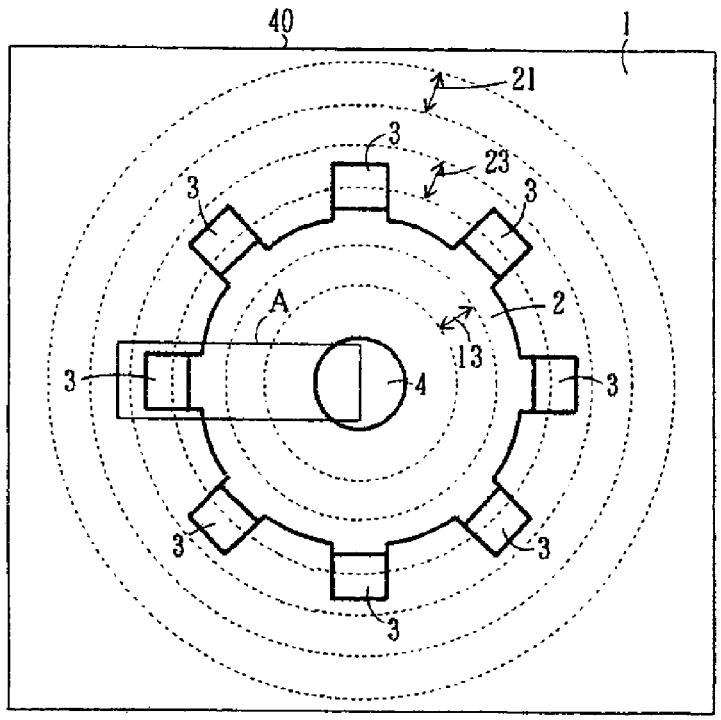
FIGS. 8A-8D schematically illustrate a JFET 302 of FIG. 7.
Figure 8B:
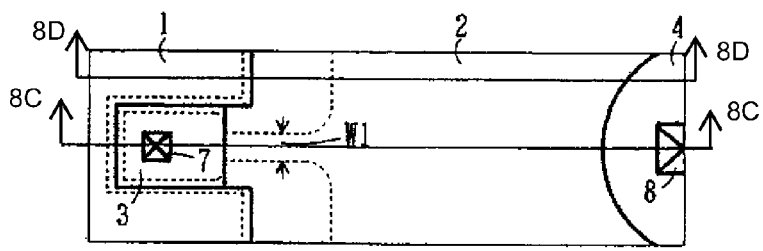
Figure 8C:
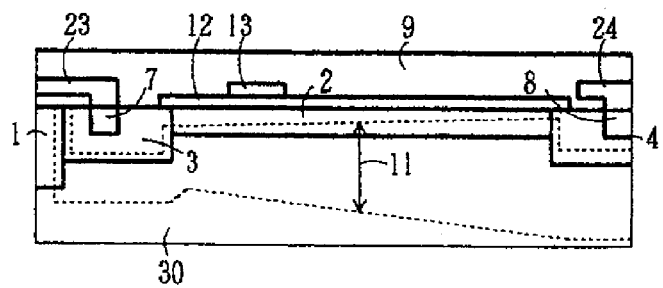
Figure 8D:
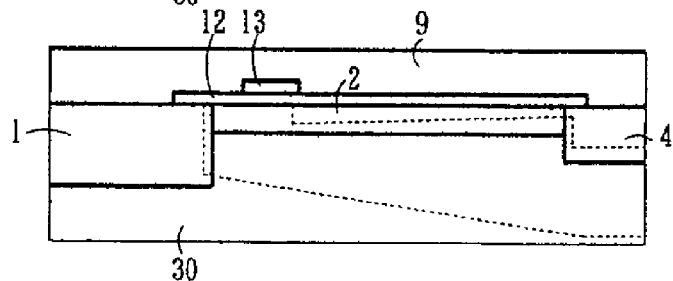

The JFET 10 of the first embodiment is shown with five source regions 3 of the JFET 125 and three source regions 3 of the JFET 124. The following example is where seven source regions 3 of the JFET 125 and one source region 3 of the JFET 124 is are used. FIG. 4 is voltage-ampere curves of a JFET 125, an NMOSFET 127, and an NMOSFET 304. The curve (a) of FIG. 4 shows the voltage-ampere curve of a JFET 125 when the drain voltage (Vjd) thereof is at 100V. The curve (b) of FIG. 4 shows the voltage-ampere curve of the NMOSFET 127 when the source voltage (Vms) of the NMOSFET 127 of FIG. 3 is at 17V. The curve (c) of FIG. 4 shows the voltage-ampere curve of the NMOSFET 304 when the source voltage (Vms) of the NMOSFET 304 of FIG. 7 is at 17V. In FIG. 4, the horizontal axis is the source terminal voltage level (Vjs) of the JFET 125 or the drain terminal voltage level (Vmd) of the NMOSFET 127 or 304, and the vertical axis is the source current (Ijs) of the JFET 125.

Figure 5:
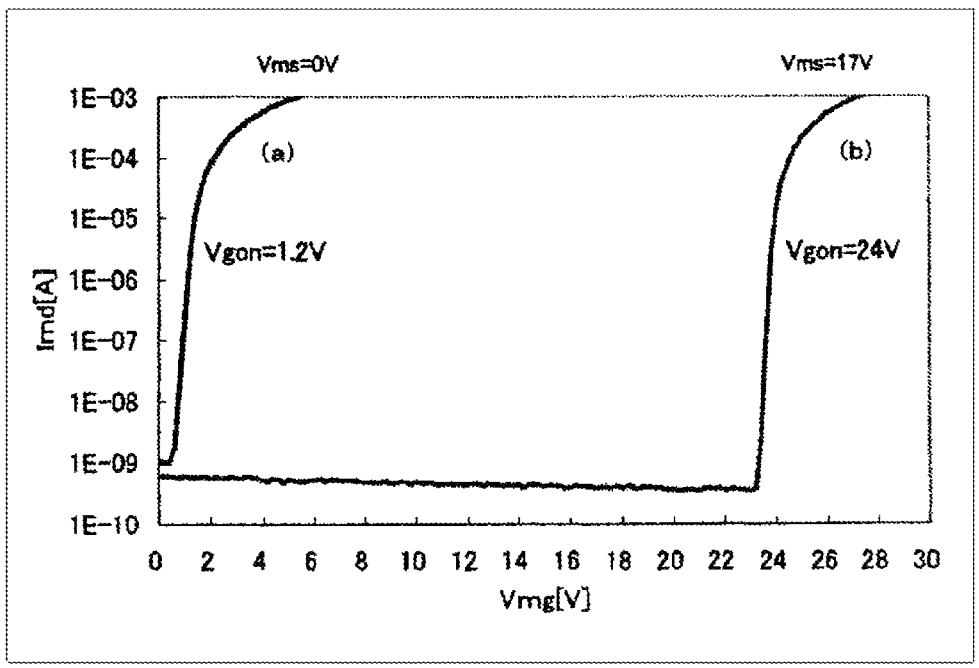
FIG. 5 illustrates curves showing a switching characteristic of the NMOSFET used as the NMOSFET 127 and the NMOSFET 304.

FIG. 5 is a curve showing the switching characteristic of the NMOSFET used as the NMOSFET 127 and the NMOSFET 304. The curve (a) of FIG. 5 shows the switching characteristic when the voltage level of the source terminal of the NMOSFET (Vms) (a charging voltage level) is at 0V. A curve (b) of FIG. 5 shows the switching characteristic when the voltage level of the source terminal of the NMOSFET (Vms)

(the charging voltage level) is at 17V. In FIG. 5, the horizontal axis is the gate terminal voltage level (Vmg) of the NMOSFET, and vertical axis is the drain current (Imd) of the NMOSFET.

Figure 6:
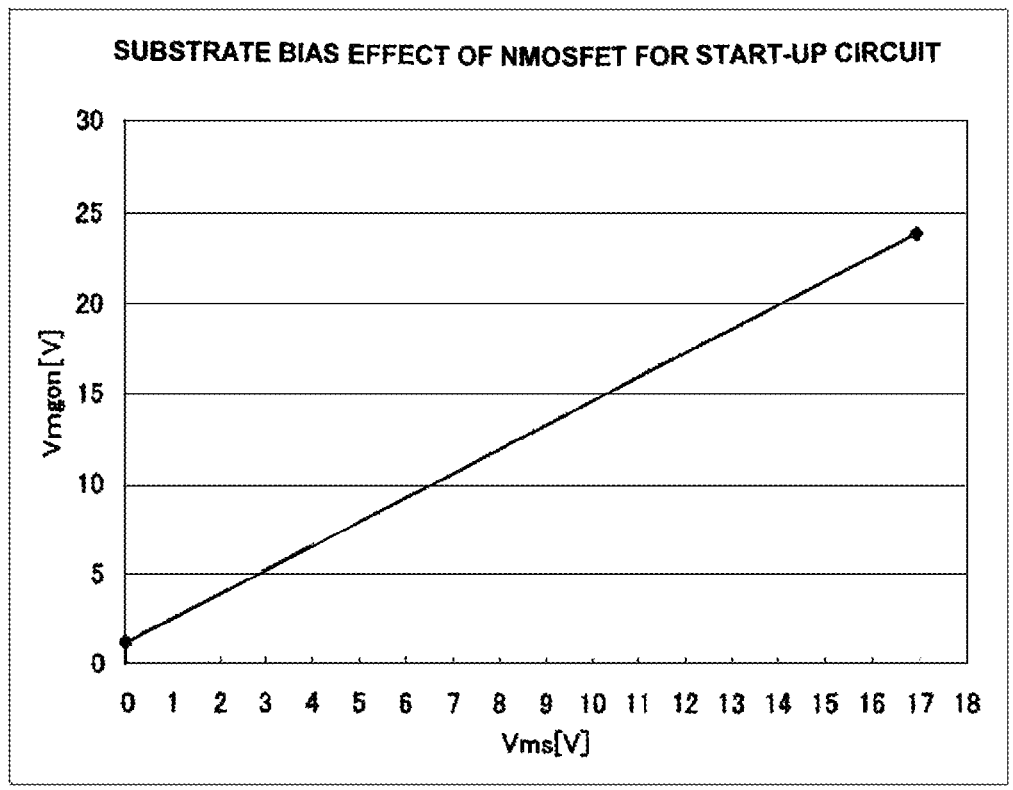
FIG. 6 is a graphic showing a substrate bias effect of the NMOSFET used as the NMOSFET 127 and the NMOSFET 304.

FIG. 6 is a graphic showing the substrate bias effect of the NMOSFET used as the NMOSFET 127 and the NMOSFET 304. In FIG. 6, the horizontal axis is the voltage level (Vms) of the source terminal of the NMOSFET, and the vertical axis is a required voltage level (Vmgon) of the gate terminal of the NMOSFET when the drain current (Imd) flows at 1 μA.

When the charging voltage level (Vms) becomes 17V, it is necessary for the voltage level (Vg) of the gate terminal 206 to be greater than 24V so that the NMOSFET 127 is maintained in the on-state at 17V in the Vms as shown in FIGS. 5 and 6 by the substrate bias effect (which is defined as an on-state when an on-current flows at 1 μA). When the Vms is at 17V, the voltage level (Vjs) of the source terminal 203B of the JFET 125 is 17.2V and current of the source terminal 203B of the JFET 125 is 5.87 mA (when the number of the sources is 7) based on an intersecting point B of FIG. 4. Therefore, current of 5.87 mA can be passed as the starting current.

When using the present JFET in the conventional switching power supply shown in FIG. 7, it is necessary to apply more than 24V to the gate terminal 306 of the NMOSFET 304 when the charging voltage (Vms) is at 17V. The voltage of the source terminal 303 (Vjs) of the JFET 302 also becomes 24V when the voltage level of the gate terminal 306 is 24V. Here, the current of 2.71 mA is obtained based on an intersection point A of FIG. 4. The curve (a) of FIG. 4, however, shows the characteristic when the number of the source regions is seven. But in the conventional JFET 302, all of eight source regions are used for passing the starting current. Therefore, the current becomes 2.71 mA×⅞=3.10 mA when the number of the source regions is converted in the case of eight. Therefore, the current of 3.10 mA can be passed as the starting current. Thus, the circuit according to the present invention can pass more starting current than the conventional circuit. Further, when the number of the source regions of the JFET 125 passing the starting current is changed from seven to five, the current becomes 5.87 mA×⅝=4.19 mA and the circuit according to the present invention in this case also can pass more starting current than the conventional circuit.

In addition, when the starting current is, for example, 7 mA as a predetermined value, Vjs is 16.8V based on FIG. 4 in the conventional circuit shown in FIG. 7 when Ijs is 7 mA×⅞=6.13 mA. Besides, Vg is 16.8V based on FIG. 6 when Vms is 11.6V. Therefore, Vms rises to only as high as 11.6V. In the circuit according to the present invention shown in FIG. 3, Vjs is 15.2V based on FIG. 4 when the starting current is 7 mA, and then Vms rises to around 15V because of Vms is approximately the same voltage level as Vjs. Thus, the circuit according to the present invention can increase the charging voltage in comparison with the conventional circuit.

Another JFET different from the JFET 302 of FIG. 7 can be formed in the switching power supply 100 shown in FIG. 3 to separate the source terminal of the JFET from the gate terminal of the NMOSFET, different from the above-described embodiments. For example, the source of the JFET 302 and the gate terminal 306 can be separated by connecting a drain of the another JFET to the terminal 301 and by connecting the source of the another JFET to the gate terminal 306. The another JFET having the same size as the JFET 302 is desirable because it is necessary for the another JFET to have the same breakdown voltage as the JFET 302 and to have the same space between the source region and the drain region as the JFET 302. In this case, a chip area becomes large, and a cost becomes higher. When the JFET 10, 10' according to the present invention is used, however, for the IC for the switching power supply, the chip area is small and the cost is lower.

As for the JFET that can be applied in the present invention, a plurality of source regions can be formed in response to one drain region, and other JFET (other than the JFET shown in the above embodiments) can be also used. For example, in the JFET 10' of the second embodiment, the gate region 1 and the metal wiring 21 need not be disposed to be in contact with the semiconductor region 22, or the gate region 1, and the semiconductor region 22 need not be formed on a portion of the drift region 2, and the metal wiring 21 need not be disposed in contact with the semiconductor region 22.

The present invention provide a junction field effect transistor (JFET), an IC for a switching power supply, and a switching power supply that can shorten the starting time by flowing more current, while maintaining a higher start-up circuit output voltage level, to solve the above-mentioned problems. A plurality of JFETs can be equivalently formed by dividing the source electrodes into a plurality of groups. A first JFET can supply current to a smoothing capacitor through an NMOSFET for starting, and a second JFET can supply a signal to the gate of the NMOSFET for starting. The shared roles allow increased supplying capability of starting current and widen the operating range of the switching power supply.

While the present invention has been particularly shown and described with reference to preferred embodiment thereof, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, JP PA 2006-082988 filed on 24 Mar. 2006. The disclosure of the priority application, in its entirety, including the drawings, claims, and the specification thereof, is incorporated by reference.

What is claimed is:

1. An integrated circuit (IC) for a switching power supply, the IC comprising:
    a start-up circuit comprising:
        a JFET having a first source electrode and a second source electrode electrically isolated from the first source electrode;
        a MOSFET of a second conductivity type having a drain terminal, a gate terminal, and a source terminal; and
        a resistor,
        wherein the drain terminal of the MOSFET is connected to the first source electrode of the JFET,
        wherein the gate terminal of the MOSFET is connected to the second source electrode of the JFET through the resistor, and is adapted to be connected to a control circuit for outputting a control signal for controlling a switching element,
        wherein the source terminal of the MOSFET is adapted to be connected to the control circuit and a capacitor, and
        wherein the JFET comprises:
            a semiconductor substrate of a first conductivity type;
            a drain region of a second conductivity type in the semiconductor substrate;
            a drain electrode electrically connected to the drain region;

a drift region of the second conductivity type in the semiconductor substrate;
a plurality of source regions of the second conductivity type in the semiconductor substrate;
a plurality of source electrodes each electrically connected to one of the source regions;
a gate region of the first conductivity in the semiconductor substrate in contact with the drift region and the source regions; and
a gate electrode electrically connected to the gate region,
wherein the drift region is between the drain region and the source regions,
wherein the source electrodes are divided into at least a first source electrode group and a second source electrode group, which is electrically isolated from the first source electrode group, and
wherein the first electrode comprises the first source electrode group and the second electrode comprises the second electrode group.

2. The IC according to claim 1, further including the control circuit, wherein the start-up circuit and the control circuit are integrated in a same semiconductor substrate.

3. The IC according to claim 1, wherein the source regions are formed circumferentially around the drift region.

4. The IC according to claim 3, wherein the source regions are equally spaced around the drift region.

5. The IC according to claim 3, wherein the gate region is selectively formed in a surface layer of the semiconductor substrate to provide a plurality of recessed regions that extend radially outwardly, and each of the source regions is in one of the recessed regions.

6. The IC according to claim 5, wherein each of the source regions occupies a portion of the respective recessed region or an entire region of the respective recessed region.

7. A switching power supply comprising:
a control circuit for outputting a control signal for controlling a switching element;
a capacitor;
a start-up circuit comprising:
a control circuit for outputting a control signal for controlling a switching element,
wherein the start-up circuit comprises:
a JFET having a first source electrode and a second source electrode electrically isolated from the first source electrode;
a MOSFET of the second conductivity type having a drain terminal, a gate terminal, and a source terminal; and
a resistor,
wherein the drain terminal of the MOSFET is connected to the first source electrode of the JFET,
wherein the gate terminal of the MOSFET is connected to the second source electrode of the JFET through the resistor, and is connected to the control circuit,
wherein the source terminal of the MOSFET is connected to the control circuit and to the capacitor, and
wherein the JFET comprises:
a semiconductor substrate of a first conductivity type;
a drain region of a second conductivity type in the semiconductor substrate;
a drain electrode electrically connected to the drain region;
a drift region of the second conductivity type in the semiconductor substrate; a plurality of source regions of the second conductivity type in the semiconductor substrate;
a plurality of source electrodes each electrically connected to one of the source regions;
a gate region of the first conductivity in the semiconductor substrate in contact with the drift region and the source regions; and
a gate electrode electrically connected to the gate region,
wherein the drift region is between the drain region and the source regions,
wherein the source electrodes are divided into at least a first source electrode group and a second source electrode group, which is electrically isolated from the first source electrode group, and
wherein the first electrode comprises the first source electrode group and the second electrode comprises the second electrode group.

8. The switching power supply according to claim 7, wherein the source regions are formed circumferentially around the drift region.

9. The switching power supply according to claim 8, wherein the source regions are equally spaced around the drift region.

10. The switching power supply according to claim 8, wherein the gate region is selectively formed in a surface layer of the semiconductor substrate to provide a plurality of recessed regions that extend radially outwardly, and each of the source regions is in one of the recessed regions.

11. The switching power supply according to claim 10, wherein each of the source regions occupies a portion of the respective recessed region or an entire region of the respective recessed region.

* * * * *